United States Patent [19]

Dou et al.

[11] Patent Number: 5,930,276
[45] Date of Patent: Jul. 27, 1999

[54] METHOD AND DEVICE FOR PROVIDING TEMPERATURE-STABLE OPTICAL FEEDBACK FOR OPTICAL PACKAGES

[75] Inventors: Xinyu Dou, Fox River Grove; Chao-pin Yeh, Schaumburg; Karl Wyatt, Cary, all of Ill.

[73] Assignee: Motrola, Inc., Schaumburg, Ill.

[21] Appl. No.: 08/999,407

[22] Filed: Dec. 29, 1997

[51] Int. Cl.$^6$ ............................... H01S 3/10; H01S 3/13; H01S 27/15

[52] U.S. Cl. .................... 372/34; 257/82; 372/29

[58] Field of Search ................. 372/34, 29, 31, 372/36, 38, 96; 257/80, 81, 82

[56] References Cited

U.S. PATENT DOCUMENTS

| | | | |
|---|---|---|---|
| 5,285,466 | 2/1994 | Tabatabaie | 372/50 |
| 5,606,572 | 2/1997 | Swirhun et al. | 372/96 |
| 5,663,944 | 9/1997 | Mun | 369/121 |
| 5,675,597 | 10/1997 | Shigihara | 372/29 |
| 5,675,600 | 10/1997 | Yamamoto et al. | 372/38 |
| 5,801,402 | 9/1998 | Shin | 257/80 |
| 5,812,582 | 9/1998 | Gilliland et al. | 372/50 |

OTHER PUBLICATIONS

"A single Transverse Mode Operation of Top Surface Emitting Laser Diode with a Integrated Photo–Diode" T. Kim, T.K. Kim, E.K. Lee, J.Y. Kim and T.I. Kim, Samsung Advanced Institute of Technology pp. 416–417. (No date).

Primary Examiner—James W. Davie
Attorney, Agent, or Firm—K. Cyrus Khosravi

[57] ABSTRACT

The present invention provides a method (600) and device (200,500) for providing temperature-stable optical feedback for optical packages. The device includes an optical emitter (202,502), a first partially reflective optical element (204, 504), a second partially reflective optical element (206,506), a first optical sensing unit (208,508), a second optical sensing unit (210,510), and a feedback unit (212). The optical emitter (202,502) is responsive to an electrical input current and generates a beam of light (214). The first optical sensing unit (208,508) and the second optical sensing unit (210,510) receive diffracted portions of the beam of light (214) from the first partially reflective optical element (204, 504) and the second partially reflective optical element (206,506) respectively and generate a first feedback signal E1 and a second feedback signal E2. The feedback unit (212) utilizing the first feedback signal E1 and the second feedback signal E2 adjusts the electrical input current to the optical emitter (202,502).

17 Claims, 4 Drawing Sheets

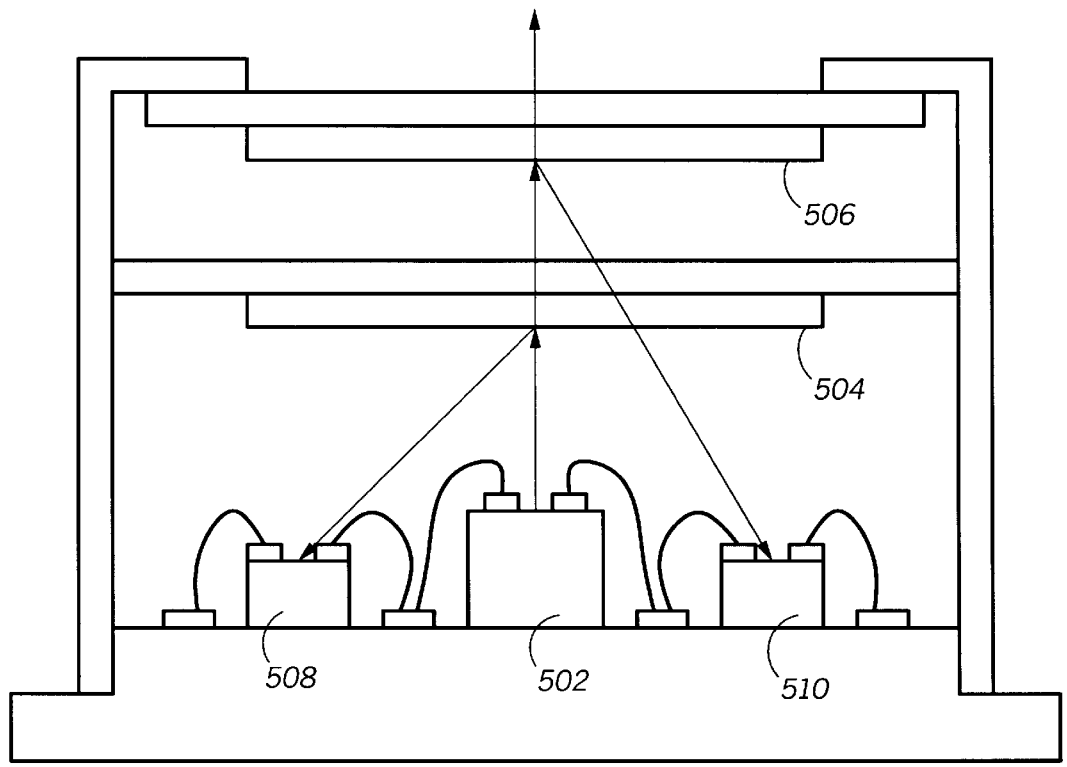

702 — GENERATING A BEAM OF LIGHT USING AN OPTICAL EMITTER, WHEREIN THE OPTICAL EMITTER IS RESPONSIVE TO AN ELECTRICAL INPUT CURRENT

704 — UTILIZING A FIRST PARTIALLY REFLECTIVE OPTICAL ELEMENT TO TRANSMIT A FIRST PREDETERMINED PORTION OF THE BEAM OF LIGHT AND DIFFRACT A SECOND PREDETERMINED PORTION OF THE BEAM OF LIGHT

706 — UTILIZING A SECOND PARTIALLY REFLECTIVE OPTICAL ELEMENT, THAT RECEIVES THE FIRST PREDETERMINED PORTION OF THE BEAM OF LIGHT TO TRANSMIT A THIRD PREDETERMINED PORTION OF THE BEAM OF LIGHT AND DIFFRACT A FOURTH PREDETERMINED PORTION OF THE BEAM OF LIGHT

708 — GENERATING THE ELECTRICAL INPUT CURRENT BY UTILIZING THE SECOND PREDETERMINED PORTION OF THE BEAM OF LIGHT AND THE FOURTH PREDETERMINED PORTION OF THE BEAM OF LIGHT

METHOD AND DEVICE FOR PROVIDING TEMPERATURE-STABLE OPTICAL FEEDBACK FOR OPTICAL PACKAGES

RELATED INVENTION

The present invention is related to the following invention which is assigned to the same assignee as the present invention:

"Device, Method, Bar Code Scanner and Optical Storage Unit for Providing Optical Feedback for an optical Emitter Using Holograms", having Ser. No. 08/682,973, now abandoned Disclosure No. SST96004, Yeh et al., filed on Jul. 16, 1996.

The subject matter of the above-identified related invention is hereby incorporated by reference into the disclosure of this invention.

FIELD OF THE INVENTION

The present invention relates to providing optical feedback for optical packages that use optical emitters and, more particularly, to using reflective optical elements as a feedback mechanism.

BACKGROUND OF THE INVENTION

FIG. 1, numeral 100 shows a conventional edge emitting laser diode 10 that is attached to a carrier 12 which is mounted on a substrate 14. A photo sensor 16 is generally placed under the rear surface/rear mirror 18 of the edge emitting laser diode 10. In most systems utilizing semiconductor lasers, dynamic stabilization and control of the optical output power is required. In edge emitting laser diodes this is usually accomplished by allowing a portion of the light 20 emitted by the laser diode, i.e., using light emitted from the laser diode's rear mirror 18 for bias control, to illuminate the photo sensor 16 which produces a photocurrent proportional to the intensity of a beam of light 22 emitted by the edge emitting laser diode 10. This optically generated photocurrent, in turn drives a feedback circuit which controls the laser bias current. In contrast, however, in an optical package utilizing a Vertical Cavity Surface Emitting Laser (VCSEL), light emitted from the rear mirror is absorbed by the GaAs substrate used in the VCSEL. Thus, the system of using light emitted from the rear mirror is unavailable for bias control in VCSEL structure.

A VCSEL is a semiconductor laser diode in which the laser oscillation and the optical emission occur in a direction normal to the pn junction plane. The VCSEL has many properties which are advantageous when compared to the more commonly used edge-emitting laser diodes. These properties include: low optical beam divergence, a circular optical output, and single longitudinal mode operation. In addition, VCSEL devices are manufactured in a manner which allows wafer level testing of individual devices. These properties make VCSELs attractive in applications such as optical data storage, data communication and laser scanners.

Presently, in a VCSEL structure, a portion of the light beam emitted from the front surface of the laser is redirected by a single reflective surface onto a photo-sensing unit for automatic power control. Although, this arrangement provides satisfactory performance under most operating circumstances, however, the automatic power control operation may be affected by a variety of environmental conditions such as temperature variations.

Thus, there is a need for an optical package with automatic power control wherein the effects of temperature variations thereon are minimized.

BRIEF DESCRIPTION OF THE DRAWINGS

FIG. 5 is a schematic representation of one embodiment of a device in accordance with the present invention.

FIG. 7 is a flow chart showing one embodiment of steps of a second method in accordance with the present invention.

DETAILED DESCRIPTION OF A PREFERRED EMBODIMENT(S)

In an embodiment of an optical package, when utilizing a single optical element such as a holographic optical element for automatic power control (APC), the operability of the APC has been adversely affected because of temperature variations. Since the laser wavelength of the optical emitter (generally in the form of a VCSEL) and the diffraction efficiency of the holographic optical element are temperature-dependent, meeting the requirements for the control of the APC may be difficult. For example, the accuracy of the APC of an optical package utilizing a single holographic optical element may fluctuate by ten percent (10%) over a temperature range of −10 degrees Celsius to 70 degrees Celsius.

The present invention generally provides for a method and device for optical packages that provides a temperature-stable optical feedback for automatic power control. The present invention can be more fully described with reference to FIGS. 2–6.

Figure 1:
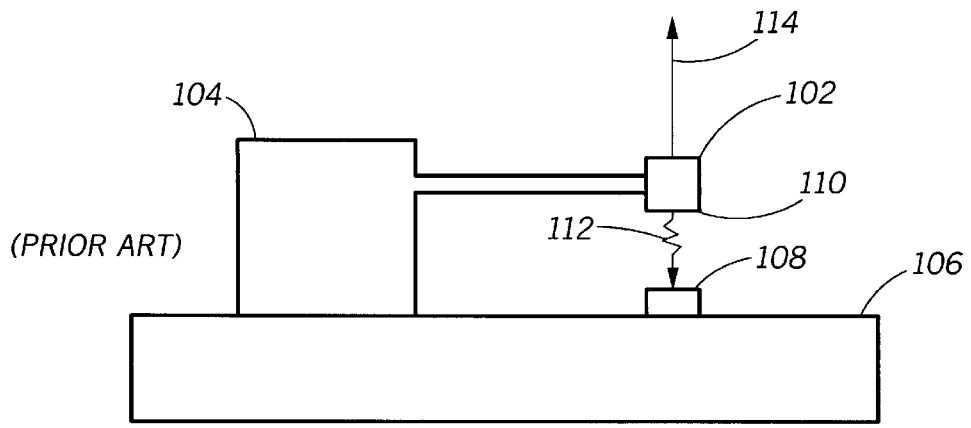
FIG. 1 is a schematic representation of a conventional edge emitting laser with a photo sensor for bias control.
Figure 2:
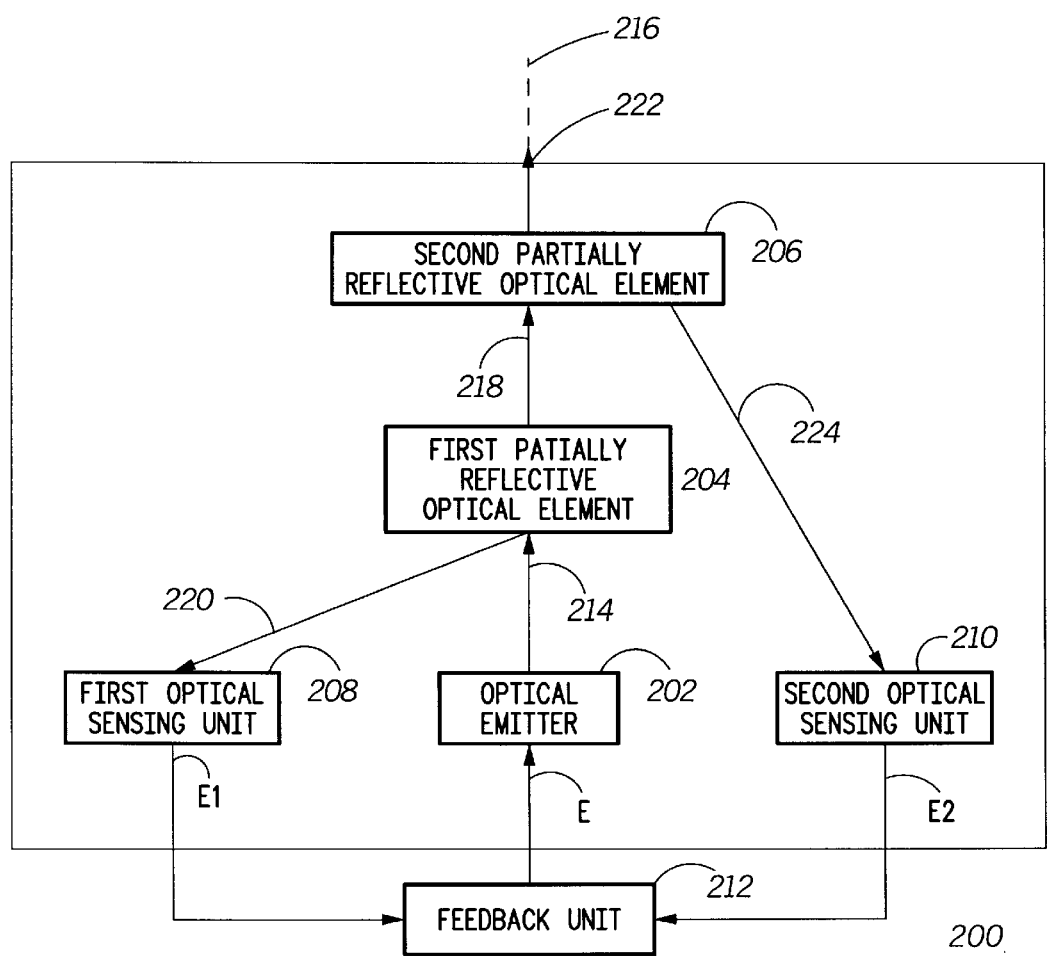
FIG. 2 is a block diagram showing one embodiment of a device in accordance with the present invention.

FIG. 2, numeral 200, is a block diagram showing one embodiment of a device in accordance with the present invention. The device for an optical package provides optical feedback and includes an optical emitter 202, a first partially reflective optical element 204, a second partially reflective optical element 206, a first optical sensing unit 208, a second optical sensing unit 210, and a feedback unit 212. The optical emitter 202 such as a VCSEL is responsive to an electrical input current E and generates a beam of light 214. The first partially reflective optical element 204 is aligned on a common axis 216 with the optical emitter 202 and is arranged to allow a first predetermined portion 218 of the beam of light to exit the first partially reflective optical element 204 and to diffract a second predetermined portion 220 of the beam of light. The second partially reflective optical element 206 is aligned on the common axis with the optical emitter 202 and the first partially reflective optical element 204 and is arranged to receive the first predetermined portion 218 of the beam of light and to allow a third predetermined portion 222 of the beam of light to exit the second partially reflective optical element 206 and to diffract a fourth predetermined portion 224 of the beam of light. The first optical sensing unit 208 is arranged to receive the second predetermined portion 220 of the beam of light and is used for generating a first electrical feedback signal E1 to the feedback unit 212 and the second optical sensing unit 210 is arranged to receive the fourth predetermined portion 224 of the beam of light and is used for generating a second electrical feedback signal E2 to the feedback unit 212. The first and second optical sensing units may be photodetectors. The feedback unit 212 is coupled to the first optical sensing unit 208 and to the second optical sensing unit 210 and is used for adjusting the electrical input current E based on the first electrical feedback signal E1 and the second electrical feedback signal E2. The feedback unit 212 provides the electrical input current E to the optical emitter 202. In this manner the output power of the optical package is automatically controlled.

In a preferred embodiment of the present invention, the first partially reflective optical element 204 and the second partially reflective optical element 206 are holographic optical elements. Moreover, in a preferred embodiment of the present invention, the holographic optical elements are substantially identical.

Figure 3:
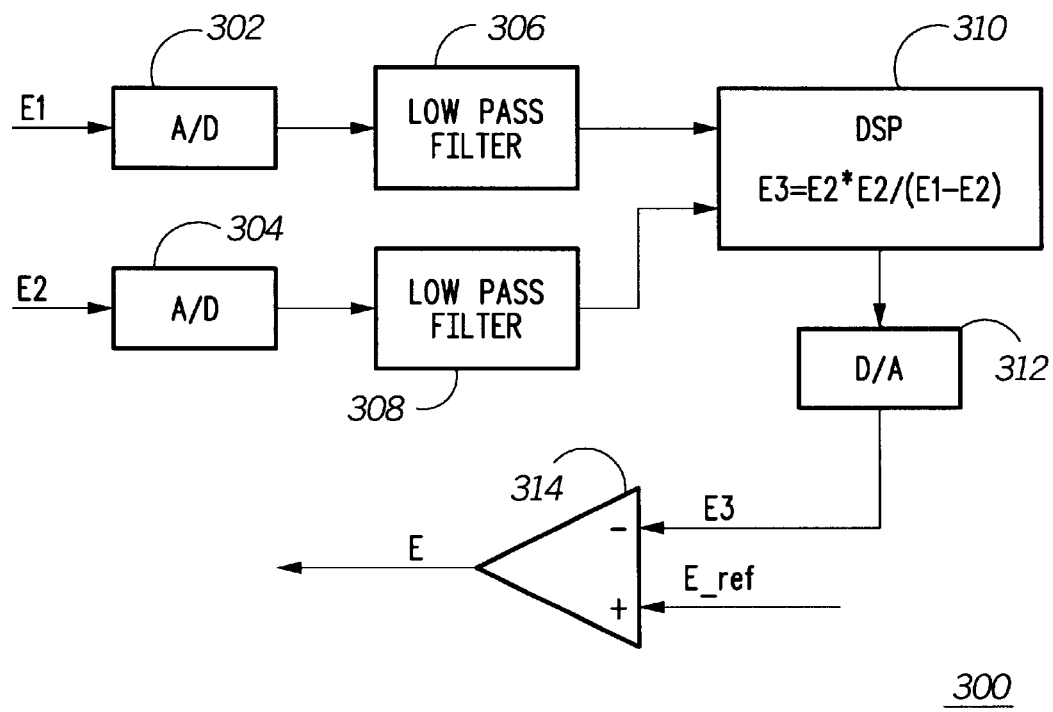
FIG. 3 is a schematic representation of a block diagram of a first aspect of the feedback unit of the device in accordance with the present invention.

FIG. 3, numeral 300, is a schematic representation of a block diagram of a first aspect of the feedback unit of the device in accordance with the present invention. The first electrical feedback signal E1 and the second electrical feedback signal E2 are provided to a first Analog-to-Digital (A/D) converter 302 and a second A/D converter 304 respectively. The outputs of the first and the second A/D converters are provided to a first low pass filter 306 and a second low pass filter 308 to remove any high frequency fluctuations. The outputs of first low pass filter 306 and the second low pass filter 308 are provided to a calculating unit in the form of a first Digital Signal Processor (DSP) 310. The first DSP 310 performs a calculation according to the following equation:

$$E3 = E2*E2/(E1-E2) \qquad (1)$$

wherein E3 represents a third electrical feedback signal, E2 represents the second electrical feedback signal, and E1 represents the first electrical feedback signal. The third electrical feedback signal E3 is fed to a Digital-to-Analog D/A converter 312 wherein an analog third electrical feedback signal E3 is provided to a comparing unit which is in the form of an operational amplifier 314. The third electrical feedback signal E3 is connected to an inverting input of the operational amplifier 314, and a predetermined reference signal E_ref is supplied to a non-inverting input of the operational amplifier 314. It is known in the art that the gain (G) of the operational amplifier is determined by the performance and stability of the overall system in which the operational amplifier is used. In the present invention, the determining factors in the stability and performance of the overall system ale the response characteristics of the optical emitter, first and second A/D converters 302,304, and first and second lowpass filters 306,308. The output of the operational amplifier 314 is the electrical input current E that is provided to the optical emitter of the device in accordance with the present invention. It should be noted that the first electrical feedback signal E1 and the second electrical feedback signal E2 are directly proportional to the optical power of the second predetermined portion 220 of the beam of light and the fourth predetermined portion 224 of the beam of light respectively.

Figure 4:
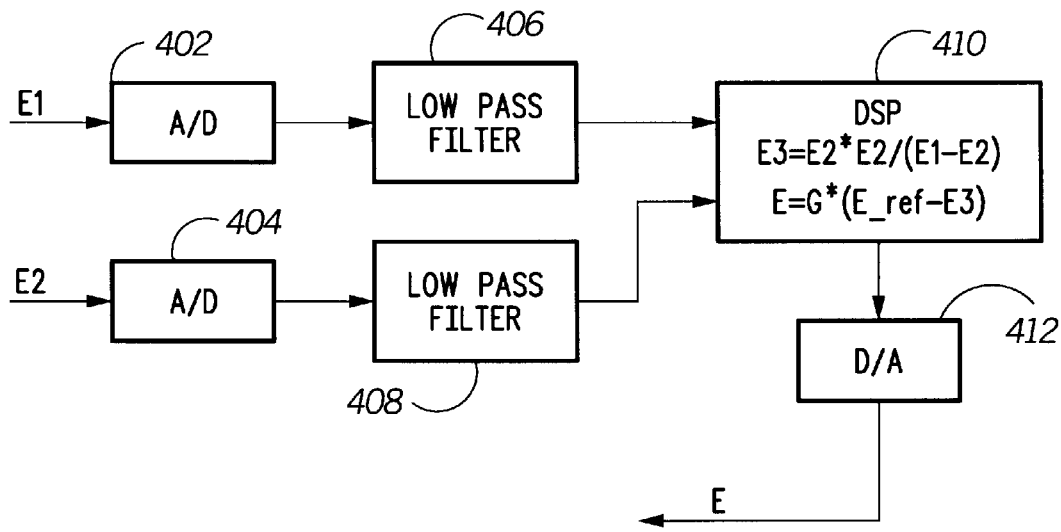
FIG. 4 is a schematic representation of a block diagram of a second aspect of the feedback unit of the device in accordance with the present invention.

FIG. 4, numeral 400, is a schematic representation of a block diagram of a second aspect of the feedback unit of the device in accordance with the present invention. As shown in FIG. 4, in the second aspect of the feedback unit, the electrical arrangement of the A/D converters 402, 404, and the lowpass filters 406, 408 are the same as the arrangement described in the first aspect of the feedback unit above. In the second aspect of the feedback unit, both of the operations of the calculating unit and the comparing unit are performed by a second DSP 410. In this aspect the second DSP 410 utilizes the equation (1) above in order to calculate the third electrical feedback signal E3. Moreover, the second DSP 410 performs the comparing operation according to the following equation:

$$E = G*(E_{13} \text{ ref} - E3) \qquad (2)$$

wherein E represents the electrical input current, G represents a predetermined gain factor, E_ref represents the predetermined reference signal. As described above, the value of G is determined by the performance and stability of the overall system. The output of the second DSP 410 is a digital representation of the electrical input current E to the optical emitter. The output of the second DSP 410 is converted into an analog current signal utilizing a second D/A converter 412. The utilization of two substantially identical holographic optical elements and performance of the calculation and comparing operations according to equations (1) and (2) described above minimizes the adverse effects of temperature variations on the diffraction efficiency of the holographic optical elements and results in a precision control of the APC in optical packages.

FIG. 5, numeral 500, is a schematic representation of one embodiment of a device in accordance with the present invention. In this embodiment the device is typically an enclosed unit having an optical emitter 502, first partially reflective optical element 504, a second partially reflective optical element 506, a first optical sensing unit 508, a second optical sensing unit 510, and a feedback unit (not shown). In the preferred embodiment of the present invention, the first and second partially reflective optical elements are substantially identical holographic optical elements.

Figure 6:
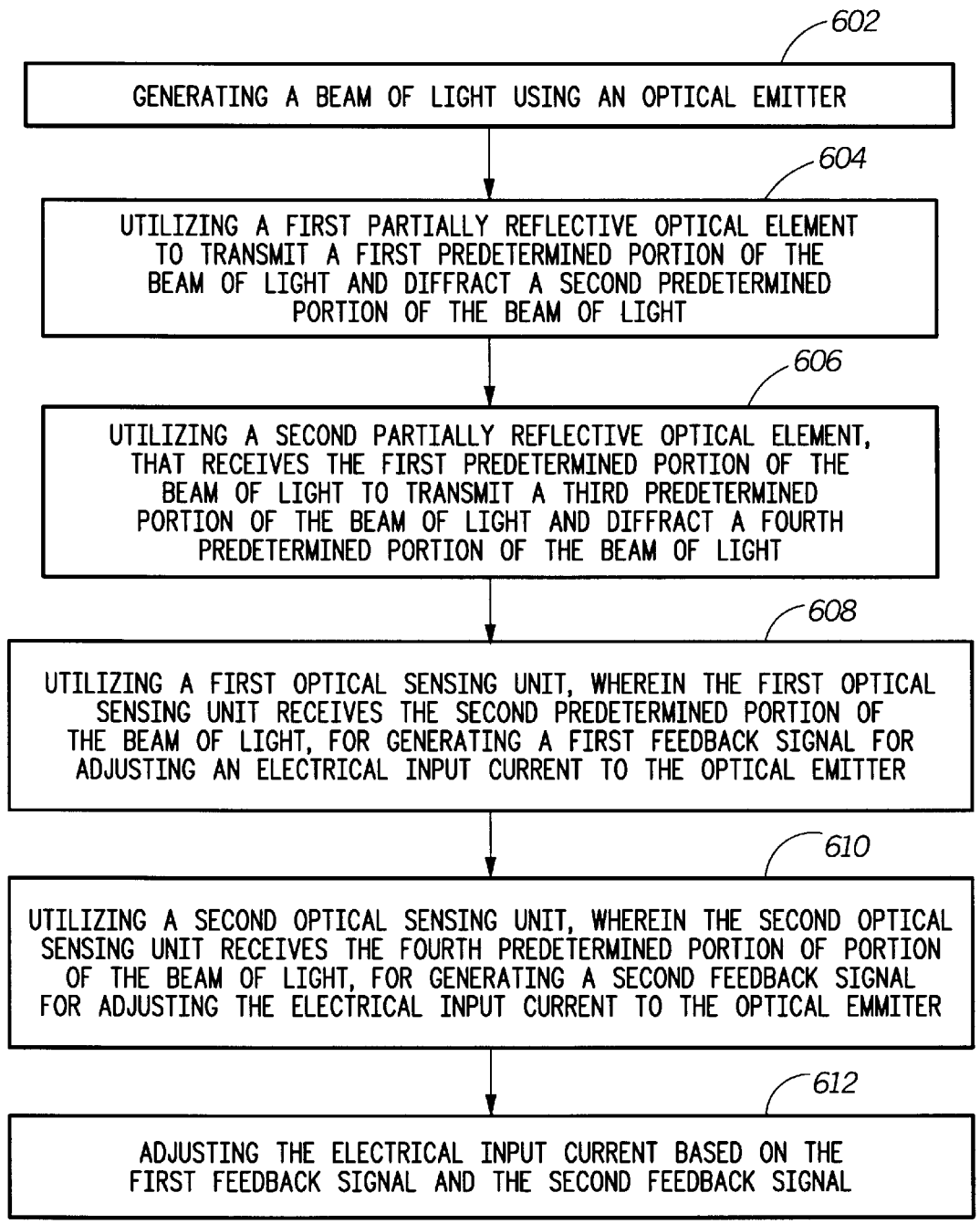
FIG. 6 is a flow chart showing one embodiment of steps of a method in accordance with the present invention.

FIG. 6. numeral 600. is a graphic representation of one embodiment of steps of a method in accordance with the present invention. The method includes the steps of: a) generating a beam of light using an optical emitter (602); b) utilizing a first partially reflective optical element to transmit a first predetermined portion of the beam of light and diffract a second predetermined portion of the beam of light (604); c) utilizing a second partially reflective optical element, that receives the first predetermined portion of the beam of light to transmit a third predetermined portion of the beam of light and diffract a fourth predetermined portion of the beam of light (606); d) utilizing a first optical sensing unit, wherein the first optical sensing unit receives the second predetermined portion of the beam of light, for generating a first feedback signal for adjusting an electrical input current to the optical emitter (608); e) utilizing a second optical sensing unit, wherein the second optical sensing unit receives the fourth predetermined portion of the beam of light, for generating a second feedback signal for adjusting the electrical input current to the optical emitter (610); and f) adjusting the electrical input current based on the first feedback signal and the second feedback signal (612).

FIG. 7, numeral 700, is a graphic representation of one embodiment of steps of a second method in accordance with the present invention. The method includes the steps of: a) generating a beam of light using an optical emitter, wherein the optical emitter is responsive to an electrical input current (702); b) utilizing a first partially reflective optical element to transmit a first predetermined portion of the beam of light and diffract a second predetermined portion of the beam of light (704); c) utilizing a second partially reflective optical element, that receives the first predetermined portion of the beam of light to transmit a third predetermined portion of the beam of light and diffract a fourth predetermined portion of the beam of light (706); and d) generating the electrical input current by utilizing the second predetermined portion of the beam of light and the fourth predetermined portion of the beam of light (708).

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

We claim:

1. A device for an optical package for providing a temperature stable optical feedback, comprising:
   a) an optical emitter, responsive to an electrical input current, for generating a beam of light;
   b) a first partially reflective optical element, aligned on a common axis with the optical emitter and arranged to allow a first predetermined portion of the beam of light to exit the first partially reflective optical element and to diffract a second predetermined portion of the beam of light;
   c) a second partially reflective optical element, aligned on the common axis with the optical emitter and the first partially reflective optical element and arranged to receive the first predetermined portion of the beam of light and to allow a third predetermined portion of the beam of light to exit the second partially reflective optical element and to diffract a fourth predetermined portion of the beam of light;
   d) a first optical sensing unit, wherein the first optical sensing unit is arranged to receive the second predetermined portion of the beam of light, for generating a first electrical feedback signal to a feedback unit;
   e) a second optical sensing unit, wherein the second optical sensing unit is arranged to receive the fourth predetermined portion of the beam of light, for generating a second electrical feedback signal to the feedback unit; and
   f) the feedback unit, coupled to the first optical sensing unit and to the second optical sensing unit, for adjusting the electrical input current based on the first electrical feedback signal and the second electrical feedback signal.

2. The device for the optical package of claim 1, wherein the first partially reflective optical element and the second partially reflective optical element are substantially identical.

3. The device for the optical package of claim 2, wherein the first partially reflective optical element and the second partially reflective optical element are holographic optical elements.

4. The device for the optical package of claim 1, wherein the feedback unit comprises:
   a calculating unit, coupled to receive the first feedback signal and the second electrical feedback signal, for generating a third electrical feedback signal; and
   a comparing unit, coupled to the calculating unit and to receive a reference signal, for generating the electrical input current to the optical emitter based on a comparison of the third electrical feedback signal and the reference signal.

5. The device for the optical package of claim 4, wherein the comparing unit is an operational amplifier.

6. The device for the optical package of claim 4, wherein a calculation by the calculating unit for generating the third electrical feedback signal is performed according to an equation of the form:

$$E3=E2*E2/(E1-E2)$$

wherein E3 represents the third electrical feedback signal, E2 represents the second electrical feedback signal, and E1 represents the first electrical feedback signal.

7. The device for the optical package of claim 1, wherein the feedback unit is a digital signal processor.

8. The device for the optical package of claim 7, wherein the digital signal processor generates the electrical input current according to equations in the form:

$$E3=E2*E2/(E1-E2) \qquad \text{a)}$$

$$E=G*(E\_ref-E3) \qquad \text{b)}$$

wherein E3 represents a third electrical feedback signal, E2 represents the second electrical feedback signal, E1 represents the first electrical feedback signal, E represents the electrical input current, E_ref represents a predetermined reference signal, and G represents a predetermined gain.

9. A method for providing a temperature stable optical feedback for an optical package, the method comprising the steps of:
   a) generating a beam of light using an optical emitter;
   b) utilizing a first partially reflective optical element to transmit a first predetermined portion of the beam of light and diffract a second predetermined portion of the beam of light;
   c) utilizing a second partially reflective optical element, that receives the first predetermined portion of the beam of light to transmit a third predetermined portion of the beam of light and diffract a fourth predetermined portion of the beam of light;
   d) utilizing a first optical sensing unit, wherein the first optical sensing unit receives the second predetermined portion of the beam of light, for generating a first feedback signal for adjusting an electrical input current to the optical emitter;
   e) utilizing a second optical sensing unit, wherein the second optical sensing unit receives the fourth predetermined portion of the beam of light, for generating a second feedback signal for adjusting the electrical input current to the optical emitter; and
   f) adjusting the electrical input current based on the first feedback signal and the second feedback signal.

10. The method for providing a temperature stable optical feedback for the optical package of claim 9, wherein adjusting the electrical input current includes the steps of:
   generating a third feedback signal based on the first feedback signal and the second feedback signal; and
   generating the electrical input current to the optical emitter based on a comparison of the third feedback signal and a reference signal.

11. The method for providing a temperature stable optical feedback for the optical package of claim 10, wherein the comparison of the third feedback signal and the reference signal is performed utilizing an operational amplifier.

12. The method for providing a temperature stable optical feedback for the optical package of claim 10, wherein generating the third feedback signal is performed according to an equation of the form:

$$E3=E2*E2/(E1-E2)$$

where E3 represents the third feedback signal, E2 represents the second feedback signal, and E1 represents the first feedback signal.

13. The method for providing a temperature stable optical feedback for an optical package of claim 9, wherein the first partially reflective optical element and the second partially reflective optical element are substantially identical.

14. The method for providing a temperature stable optical feedback for the optical package of claim 13, wherein the first partially reflective optical element and the second partially reflective optical element are holographic optical elements.

15. The method for providing a temperature stable optical feedback for the optical package of claim 9, wherein the step of adjusting the electrical input current is performed utilizing a digital signal processor.

16. The method for providing a temperature stable optical feedback for the optical package of claim 10, wherein the digital signal processor generates the electrical input current according to equations in the form:

$$E3 = E2 * E2/(E1-E2) \quad \text{a)}$$

$$E = G*(E\_\text{ref} - E3) \quad \text{b)}$$

wherein E3 represents a third feedback signal, E2 represents a second feedback signal, E1 represents a first feedback signal, E represents the electrical input current, E_ref represents a predetermined reference signal, and G represents a predetermined gain.

17. A method for providing a temperature stable optical feedback for an optical package, the method comprising the steps of:

a) generating a beam of light using an optical emitter, wherein the optical emitter is responsive to an electrical input current;

b) utilizing a first partially reflective optical element to transmit a first predetermined portion of the beam of light and diffract a second predetermined portion of the beam of light;

c) utilizing a second partially reflective optical element, that receives the first predetermined portion of the beam of light to transmit a third predetermined portion of the beam of light and diffract a fourth predetermined portion of the beam of light; and d) generating the electrical input current by utilizing the second predetermined portion of the beam of light and the fourth predetermined portion of the beam of light.

* * * * *